(12) United States Patent  
Yoshikawa

(10) Patent No.: US 8,125,027 B2  
(45) Date of Patent: Feb. 28, 2012

(54) SEMICONDUCTOR DEVICE HAVING TRENCHES EXTENDING THROUGH CHANNEL REGIONS

(75) Inventor: Koh Yoshikawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/082,140

(22) Filed: Apr. 7, 2011

(65) Prior Publication Data

US 2011/0180909 A1  Jul. 28, 2011

Related U.S. Application Data

(62) Division of application No. 11/614,515, filed on Dec. 21, 2006, now Pat. No. 7,943,991.

(30) Foreign Application Priority Data

Dec. 22, 2005 (JP) .................................. 2005-370332  
Sep. 15, 2006 (JP) .................................. 2006-250382

(51) Int. Cl.  
*H01L 29/66* (2006.01)

(52) U.S. Cl. .................... 257/330; 257/282; 257/283

(58) Field of Classification Search .......... 257/282–283, 257/329–332, E29.201, E29.257, E29.26, 257/E21.548, E21.549; 438/270–272  
See application file for complete search history.

(56) References Cited

U.S. PATENT DOCUMENTS 4,316,203 A  2/1982  Tohgei

FOREIGN PATENT DOCUMENTS

| JP | 2000-260984 A | 9/2000 |
|---|---|---|
| JP | 2001-332726 A | 11/2001 |
| JP | 2002-076339 A | 3/2002 |
| JP | 2002-184985 A | 6/2002 |
| JP | 2003-124464 A | 4/2003 |
| JP | 2004-200441 A | 7/2004 |
| JP | 2005-019528 A | 1/2005 |

*Primary Examiner* — Tucker Wright  
(74) *Attorney, Agent, or Firm* — Rossi, Kimms & McDowell LLP

(57) ABSTRACT

A semiconductor device includes an n-type semiconductor substrate, an alternating conductivity type layer on semiconductor substrate, the alternating conductivity type layer including n-type drift regions and p-type partition regions arranged alternately, p-type channel regions on the alternating conductivity type layer, and trenches formed from the surfaces of the p-type channel regions down to respective n-type drift regions or both the n-type drift regions and the p-type partition regions. The bottom of each trench is near or over the pn-junction between the p-type partition region and the n-type drift region. The semiconductor device facilitates preventing the on-resistance from increasing, obtaining a higher breakdown voltage, and reducing the variations caused in the characteristics thereof.

4 Claims, 16 Drawing Sheets

SEMICONDUCTOR DEVICE HAVING TRENCHES EXTENDING THROUGH CHANNEL REGIONS

CROSS REFERENCE TO RELATED APPLICATIONS

This is a division of Ser. No. 11/614,515 filed 21 Dec. 2006, application claims priority from Japanese application Serial Nos. JP 2005-370332 and JP 2006-250382, filed on 22 Dec. 2005 and 15 Sep. 2006, respectively, the contents of which are incorporated by reference herein in their entirety.

BACKGROUND OF THE INVENTION

A. Field of the Invention

The present invention relates to vertical insulated gate semiconductor devices for high power use. Specifically, the present invention relates to super-junction trench-gate semiconductor devices which include trenches, trench gates in the respective trenches, each of the trench gates including an insulator film formed in the trench and a control electrode formed in the trench with the insulator film interposed between the control electrode and trench, and a super-junction layer such as an alternating conductivity type layer in the semiconductor substrate thereof.

B. Description of the Related Art

Recently, intensive efforts have been focused on improving the performance of power semiconductor devices, in order to meet the demands in the field of power electronics for power supply apparatuses with reduced dimensions and higher capabilities. The improved performance sought for the power semiconductor devices include realizing a higher breakdown voltage in the power semiconductor devices, realizing a higher current capacity therein, reducing the losses caused therein, realizing a higher breakdown withstanding capability therein, and making the power semiconductor devices work at a higher speed. A super-junction substrate is known as a substrate structure favorable for introducing the improvements described above. A power semiconductor device having a planar MOS structure or a trench MOS structure has been proposed as a surface structure of a power semiconductor device favorable for introducing the improvements described above.

The super-junction semiconductor substrate is a semiconductor substrate including an alternating conductivity type layer including semiconductor regions of a first conductivity type (e.g., n-type drift regions) and semiconductor regions of a second conductivity type (e.g., p-type partition regions) bonded alternately to each other.

A technique that facilitates realizing a low on-resistance by the super-junction trench-gate MOSFET structure that combines the super-junction semiconductor substrate described above with a vertical MOS power device structure and a trench MOS power device structure also known to those skilled in the art. For example, a conventional semiconductor device that employs a super-junction semiconductor substrate is disclosed in FIG. 16, in which the pn-junctions in alternating conductivity type layer 1601 and trench gates 1602 are extended perpendicularly (cf. Published Unexamined Japanese Patent Applications 2000-260984 and 2005-19528). Other conventional semiconductor devices that employ super-junction semiconductor substrates as shown in FIGS. 17 through 19B have been disclosed, in which the pn-junctions in alternating conductivity type layers 1701, 1801 and 1901 and respective trench gates 1702, 1802 and 1902 are extended in parallel to each other (cf. Published Unexamined Japanese Patent Applications 2002-76339 and 2001-332726). The MOSFETs that include the super-junction trench gates as described above realize low on-resistance.

However, it has been well known to those skilled in the art that there exists a tradeoff relation between the on-resistance per unit area and the avalanche breakdown voltage (that has a certain relation with the breakdown voltage of the device) in MOSFETs and such unipolar devices. The tradeoff relation exists in the devices described in the Published Unexamined Japanese Patent Applications 2000-260984, 2005-19528, 2002-76339, and 2001-332726. If one tries to decrease the on-resistance, the breakdown voltage will be decreased. If one tries to increase the breakdown voltage, the on-resistance will be increased.

For example, although the on-resistance may be decreased by the semiconductor device structure described in Published Unexamined Japanese Patent Application 2001-332726, the breakdown voltage is decreased. This is because the trench bottom cuts across the region of the semiconductor substrate in which the electric field strength is high. Moreover, it has been known that there exist limits in silicon and SiC, beyond which both the on-resistance and the breakdown voltage can not exceed physically. Hereinafter, the limits will be referred to as the "semiconductor limits."

In designing MOSFETs and such semiconductor devices, the semiconductor limits are considered as the characteristics of the substrate section in the MOSFETs and such semiconductor devices. However, the influences of the voltage drop and the breakdown voltage lowering caused in the MOS channel section by making the semiconductor device work as a MOSFET are not considered. Therefore, the performance of the semiconductor device as a MOSFET are impaired.

Since the channel is longer in the structure shown in FIGS. 19A and 19B than in the structure shown in FIGS. 18A and 18B, the voltage drop is larger in the structure shown in FIGS. 19A and 19B than in the structure shown in FIGS. 18A and 18B.

Since the semiconductor devices are designed considering the variations that will be caused through the manufacture thereof, the semiconductor devices are not always provided with respective structures that facilitate exhibiting the best performances.

In view of the foregoing, it would be desirable to obviate the problems of the conventional techniques described above. It would also be desirable to provide a semiconductor device that facilitates preventing the on-resistance thereof from increasing, obtaining a higher breakdown voltage, and reducing the variations caused in the characteristics thereof. It would be further desirable to provide a method of manufacturing such a favorable semiconductor device as described above.

The present invention is directed to overcoming or at least reducing the effects of one or more of the problems set forth above.

SUMMARY OF THE INVENTION

There is provided according to the invention a semiconductor device including a semiconductor substrate of a first conductivity type, an alternating conductivity type layer on the semiconductor substrate, the alternating conductivity type layer including first semiconductor regions of the first conductivity type and second semiconductor regions of a second conductivity type arranged alternately, channel regions of the second conductivity type on the alternating conductivity type layer, trenches extended from the surfaces of the channel regions down to the respective first semiconductor regions, and the bottom of the trench being closer to the second semiconductor region than to the center of the first semiconductor region.

In one embodiment, the bottom of the trench is formed over a first boundary between the first semiconductor region and the second semiconductor region in the semiconductor device. In accordance with another embodiment, the opening width of the trench is narrower than the range between the center of the first semiconductor region and the second boundary of the second semiconductor region opposite to the first boundary, across which the second semiconductor region and the other first semiconductor region are in contact with each other in the semiconductor device.

In another embodiment, the bottom of the trench exhibits a predetermined curvature in the semiconductor device. In a further embodiment, the deepest part in the bottom of the trench is positioned on the first boundary in the semiconductor device.

According to another embodiment, the semiconductor device also includes source regions of the first conductivity type, each of the source regions being formed on the opening edge of the trench in the surface portion of the channel region on the first semiconductor region. According to yet another embodiment, the semiconductor device further includes body regions of the second conductivity type in contact with the trenches, each of the body regions being in the surface portion of the channel region on the second semiconductor region.

According to a further embodiment, the channel region on the second semiconductor region is doped more heavily than the channel region on the first semiconductor region in the semiconductor device. According to another embodiment, the channel region on the second semiconductor region is formed more shallowly than the bottom of the trench in the semiconductor device.

According to a further embodiment, the portion of the trench extending into the first semiconductor region is 1.5 µm or less in length in the depth direction in the semiconductor device.

According to another embodiment, the portion of the trench extending into the first semiconductor region is 1.0 µm or more in length in the depth direction in the semiconductor device.

According to a further embodiment, the portion in the trench bottom, in which the electric field strength is high, is displaced from the portion in the alternating conductivity type layer, in which electric field strength is high. Therefore, the breakdown voltage of the semiconductor device is increased. According to a preferred embodiment, the breakdown voltage variations are reduced.

According to another embodiment, the MOS channel is prevented from working. Therefore, the on-resistance variations are reduced. According to yet another embodiment, the breakdown voltage of the semiconductor device is increased and the breakdown voltage variations are reduced.

The semiconductor device according to the invention facilitates preventing the on-resistance thereof from increasing, realizing a higher breakdown voltage, and reducing the variations caused in the characteristics thereof.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now the invention will be described in detail hereinafter with reference to the accompanied drawings which illustrate the preferred embodiments of the invention. In the following descriptions and accompanied drawings, the first conductivity type is an n-type and the second conductivity type is a p-type.

First Embodiment

Figure 1:
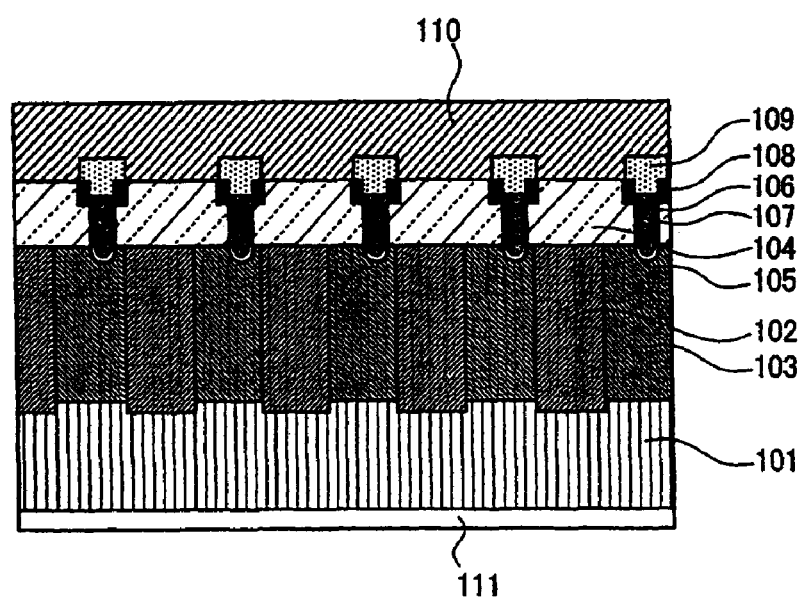
FIG. 1 is a cross sectional view of a semiconductor device according to a first embodiment of the invention.

First, a semiconductor device structure according to the first embodiment of the invention will be described below. FIG. 1 is a cross sectional view of a semiconductor device according to the first embodiment of the invention. Referring now to FIG. 1, an alternating conductivity type layer including p-type partition regions (second semiconductor regions of the second conductivity type) 102 and n-type drift regions (first semiconductor regions of the first conductivity type) 103 arranged alternately is formed on an n-type semiconductor substrate (semiconductor substrate of the first conductivity type) 101. In the following descriptions, the direction in which p-type partition regions 102 and n-type drift regions 103 are arranged alternately will be referred to as the "first direction." The direction along which p-type partition regions 102 and n-type drift regions 103 extend will be referred to as the "second direction."

The impurity concentration in p-type partition region 102 and n-type drift region 103 is, for example, $3.0 \times 10^{15}$ cm$^{-3}$. The p-type partition region 102 and n-type drift region 103 are 6 μm in width. The width of a pair of p-type partition region 102 and n-type drift region 103 constituting an alternating conductivity type layer is 12 μm.

The widths of p-type partition region 102 and n-type drift region 103 are measured in the first direction. If not described otherwise, the widths are measured in the first direction. The p-type partition regions 102 and n-type drift regions 103 extend from one side to the other side of semiconductor substrate 1 in the second direction and are shaped with respective stripes bonded alternately to each other in the first direction.

On the alternating conductivity type layer, p-type channel regions (channel regions of the second conductivity type) 104 are formed. The impurity concentration is higher in p-type channel region 104 above p-type partition region 102 than in p-type channel region 104 above n-type drift region 103. Trenches 105 are formed in the surface portions of respective p-type channel regions 104.

Trench 105 extends down into n-type drift region 103 such that trench 105 is displaced from the center of n-type drift region 103 toward p-type partition region 102. It is preferable for trench 105 to be displaced in the first direction for 2.5 μm or more from the center of n-type drift region 103. Trenches 105 extend almost at a 90 degree angle with respect to semiconductor substrate 101. The bottom portion of trench 105 is in n-type drift region 103. For example, trenches 105 are 4 μm in depth and extend for about 1 μm from p-type channel regions 104 into respective n-type drift regions 103.

The opening width of trench 105 is about 1 μm, which is sufficiently shorter than the width of a pair of p-type partition region 102 and n-type drift region 102 (12 μm). In FIG. 1, one trench 105 is formed in one n-type drift region 103. Alternatively, one or two trenches 105 may be formed in a plurality of n-type drift regions 103.

The curvature in the bottom portion of trench 105 is 0.5 μm. Trenches 105, the bottom cross section of which is semicircular in the first direction, extend in the second direction. Gate oxide film 106 is formed in trench 105 along the side wall of the trench. Gate oxide film 106 is about 0.1 μm in thickness. Gate electrode 107 is formed in trench 105 with gate oxide film 106 interposed between gate electrode 107 and trench 105. The curvature in the bottom portion of gate electrode 107 is about 0.4 μm.

In the surface portion of p-type channel region 104, n-type source regions 108 are formed such that n-type source regions 108 are in contact with the respective outer side walls of trenches 105 on both side walls of p-type channel region 104. In other words, a pair of n-type source regions 108 is in contact with both side walls of trench 105. Interlayer insulator films 109 are formed in such a manner that each interlayer insulator film 109 covers trench 105 and a part of n-type source regions 108.

Source electrode 110 is formed in such an arrangement that source electrode 110 covers p-type channel regions 104 and interlayer insulator films 109. Drain electrode 111 is formed on the surface of n-type semiconductor substrate 1 opposite to the surface on which source electrode 110 is formed.

In FIG. 1, one trench 105 is formed in one n-type drift region 103. Alternatively, one or two trenches 105 may be formed in a plurality of n-type drift regions 103. For decreasing the on-resistance of a semiconductor device, it is preferable to form many trenches 105 in n-type drift region 103. When the width of p-type partition region 102 and the width of n-type drift region 103 are the same, many trenches 105 are favorable for forming more trench gates, resulting in an increased channel density.

As described above, the trench bottom is displaced from the region of the semiconductor substrate in which the electric field strength is high in the semiconductor device according to the first embodiment of the invention. Therefore, the semiconductor device according to the first embodiment facilitates increasing the breakdown voltage.

Second Embodiment

Figure 2:
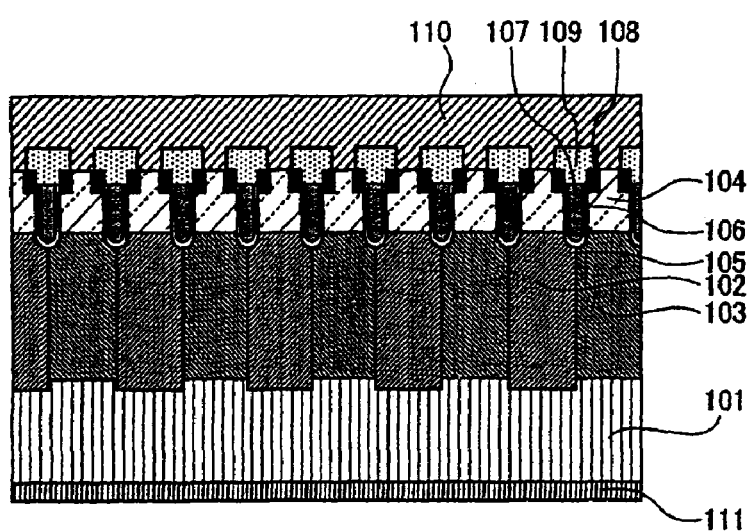
FIG. 2 is a cross sectional view of a semiconductor device according to a second embodiment of the invention.

Now, a semiconductor device structure according to a second embodiment of the invention will be described below. FIG. 2 is a cross sectional view of a semiconductor device according to the second embodiment of the invention. According to the first embodiment, trenches 105 are formed such that trenches 105 are not in contact with p-type partition regions 102. According to the second embodiment, trenches 105 are formed such that the center of the width in the first direction of each trench 105 is positioned on the junction between p-type partition region 102 and n-type drift region 103. Since the other structures are the same with those according to the first embodiment, the duplicated descriptions thereof are omitted for the sake of simplicity.

In FIG. 2, trench 105 is formed such that the center of the width thereof in the first direction is positioned on the junction between p-type partition region 102 and n-type drift region 103. In more detail, the deepest bottom portions of trenches 105 are positioned on the respective pn-junctions. The spacing between trenches 105 is about 5 µm. To decrease the on-resistance, it is preferable to form more trenches 105 in contact with n-type drift regions 103.

First Method of Manufacturing Semiconductor Device

Figure 3A:
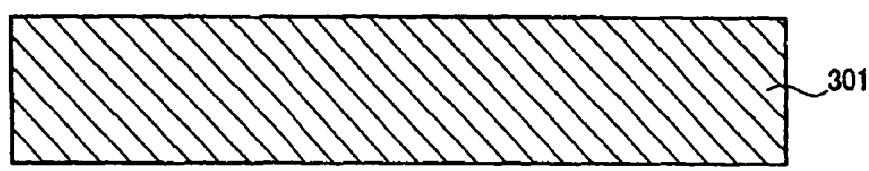
FIG. 3A is a first cross sectional view of the semiconductor device shown in FIG. 1 or 2 under the manufacture thereof by a first manufacturing method.

Next, a first method of manufacturing a semiconductor device according to the first or second embodiment will be described below. The manufacturing method will be described in connection with a super-junction MOSFET exhibiting a breakdown voltage of the 600 V class and focusing on the alternating conductivity type layer thereof. FIGS. 3A through 3E are cross sectional views of the semiconductor device according to the first or second embodiment under the manufacture thereof by the first manufacturing method. Referring first to FIG. 3A, an n-type semiconductor substrate 301 (semiconductor substrate of the first conductivity type), covered with (100) faces and very heavily doped, is prepared. For example, an n-type silicon substrate with low resistance, the impurity concentration such as the antimony concentration therein is around $2 \times 10^{18}$ cm$^{-3}$, is used for n-type semiconductor substrate 301.

Figure 3B:
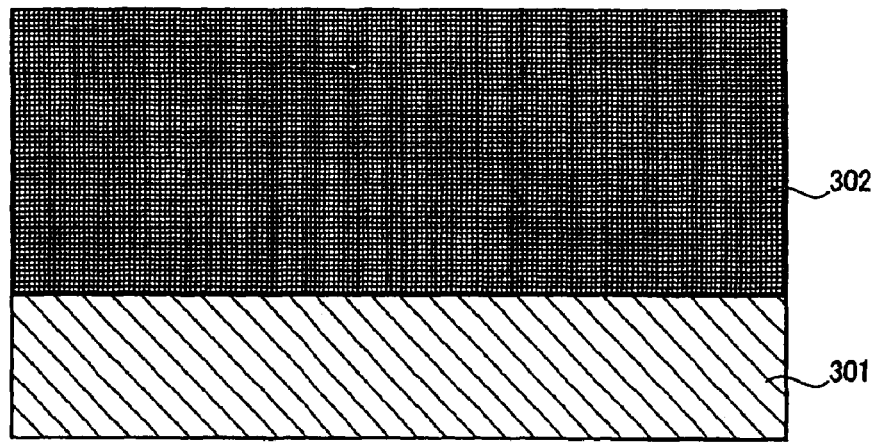
FIG. 3B is a second cross sectional view of the semiconductor device shown in FIG. 1 or 2 under the manufacture thereof by the first manufacturing method.

Referring now to FIG. 3B, an n-type silicon layer 302 of about 50 µm in thickness, the impurity concentration such as the phosphorus concentration of which is about $3.6 \times 10^{15}$ cm$^{-3}$, is formed on n-type semiconductor substrate 301.

Figure 3C:
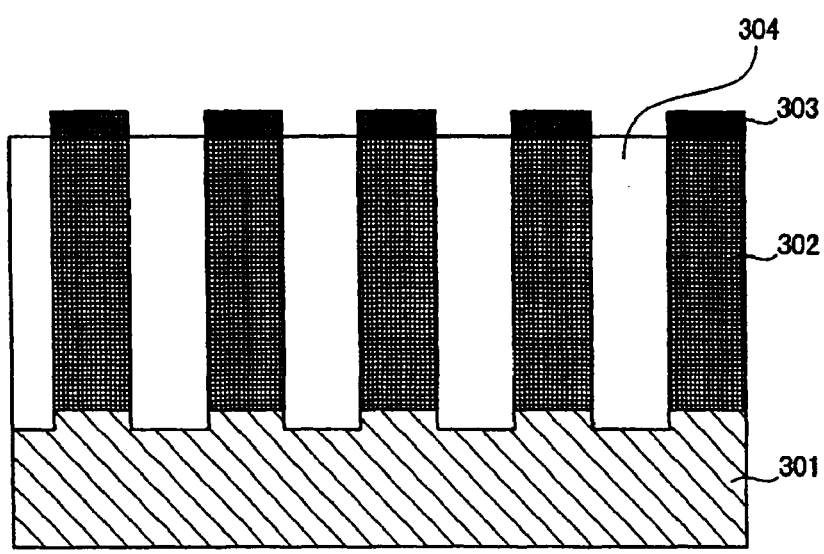
FIG. 3C is a third cross sectional view of the semiconductor device shown in FIG. 1 or 2 under the manufacture thereof by the first manufacturing method.

Referring now to FIG. 3C, an oxide film (or a nitride film) of 1.6 µm in thickness is formed on n-type silicon layer 302. The thickness of the oxide film (or the nitride film) is set based on the selective etching ratio of the oxide film (or the nitride film) and silicon so that the oxide film (or the nitride film) remains after the trenches of 50 µm in depth are formed. Then, the oxide film (or the nitride film) is patterned by photolithography or by etching to form mask 303 for trench etching.

The width of the oxide film (or the nitride film) and the opening width in mask 303 are 6 µm, respectively. In other words, masks 303 of 6 µm in width are arranged such that masks 303 are spaced 6 µm apart from each other. Then, trenches 304 are formed in n-type silicon layer 302, for example, by dry etching.

Figure 3D:
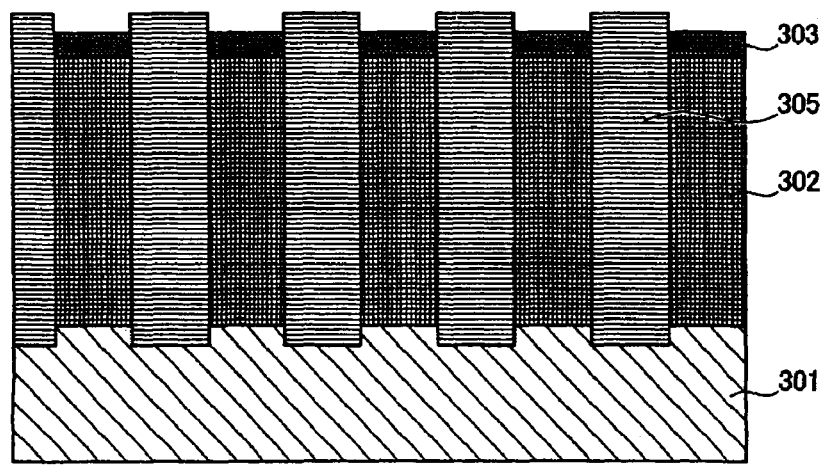
FIG. 3D is a fourth cross sectional view of the semiconductor device shown in FIG. 1 or 2 under the manufacture thereof by the first manufacturing method.

Referring now to FIG. 3D, p-type semiconductor layer 305, containing a predetermined concentration of boron as a p-type impurity, is formed by epitaxial growth in trench 304. The epitaxial layer of p-type semiconductor layer 305 is grown such that p-type semiconductor layer 305 stands higher than the upper surface of mask 303.

Figure 3E:
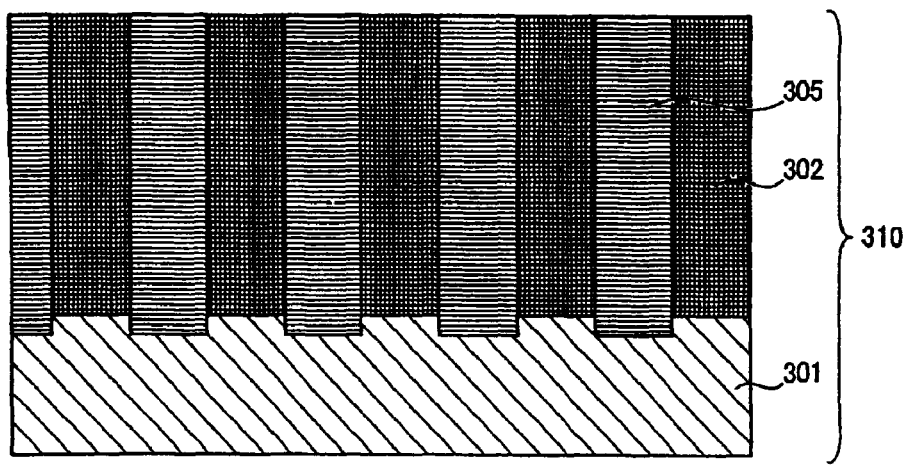
FIG. 3E is a fifth cross sectional view of the semiconductor device shown in FIG. 1 or 2 under the manufacture thereof by the first manufacturing method.

Referring now to FIG. 3E, the surface of the alternating conductivity type layer is smoothed by chemical mechanical polishing (hereinafter referred to as "CMP") and by etching the oxide film to form a super-junction semiconductor substrate 310. At this stage, the alternating conductivity type layer in super-junction semiconductor substrate 310 is set, for example, at 47 µm in thickness. Then, trenches 105 shown in FIG. 2, having a depth of 3.5 µm and an opening width of 1.2 µm, are formed by the conventional technique. Trenches 105 are formed at a pitch of 6 µm and spaced apart for an equal spacing from each other.

If trenches 105 are formed very carefully, it will be possible to adjust the bottom curvature of trench 105 at 0.6 µm. Then, gate oxide films 106 of 100 nm in thickness are grown and gate electrodes 107 are buried. Next, p-type channel regions 104 and n-type source regions 108 are formed, and interlayer insulator films 109, source electrode 110, drain electrode 111, and passivation layers are formed. Thus, the super-junction MOSFET shown in FIG. 1 or 2 is completed.

Second Method of Manufacturing Semiconductor Device

Now a second method of manufacturing the semiconductor device shown in FIG. 1 or 2 will be described below. The second manufacturing method will be described in connection with a super-junction MOSFET exhibiting a breakdown voltage of the 600 V class and focusing on the alternating conductivity type layer thereof. FIGS. 4A through 4E are cross sectional views of the semiconductor device according to the first or second embodiment under the manufacture thereof by the second manufacturing method.

Figure 4A:
FIG. 4A is a first cross sectional view of the semiconductor device shown in FIG. 1 or 2 under the manufacture thereof by a second manufacturing method.
Figure 4B:
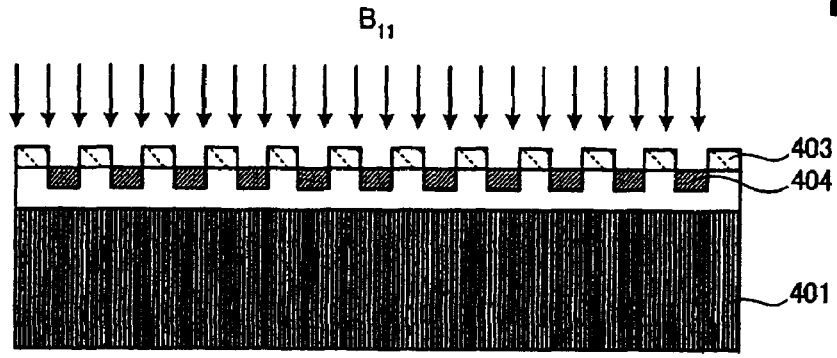
FIG. 4B is a second cross sectional view of the semiconductor device shown in FIG. 1 or 2 under the manufacture thereof by the second manufacturing method.

Referring now to FIG. 4A, an epitaxial growth layer 402 of 6 to 10 µm in thickness is formed by the epitaxial growth technique on a heavily doped n-type semiconductor substrate 401. Referring now to FIG. 4B, p-type impurity ions such as boron ions are implanted at a predetermined concentration into the regions of epitaxial growth layer 402 which will be p-type partition regions 102 of an alternating conductivity type layer, using photoresist for mask 403. In FIG. 4B, the reference numeral 404 designates the regions into which p-type impurity ions such as boron ions are implanted.

Figure 4C:
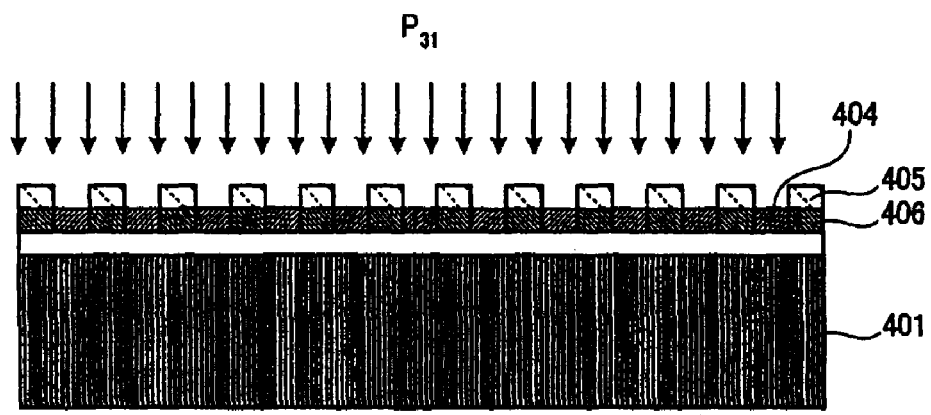
FIG. 4C is a third cross sectional view of the semiconductor device shown in FIG. 1 or 2 under the manufacture thereof by the second manufacturing method.
Figure 4D:
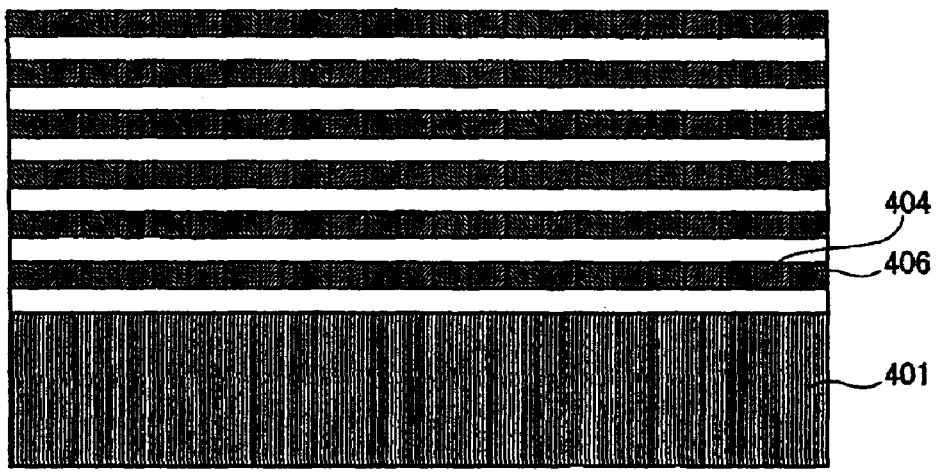
FIG. 4D is a fourth cross sectional view of the semiconductor device shown in FIG. 1 or 2 under the manufacture thereof by the second manufacturing method.

Referring now to FIG. 4C, n-type impurity ions such as phosphorus ions are implanted at a predetermined concentration into the regions of epitaxial growth layer 402 which will be n-type drift regions 103 of the alternating conductivity type layer, using another photoresist for mask 405. In FIG. 4C, the reference numeral 406 designates the regions into which n-type impurity ions such as phosphorus ions are implanted. Alternatively, the step described in FIG. 4C may be conducted prior to the step described in FIG. 4B. As described in FIG. 4D, the steps described with reference to FIGS. 4B and 4C are repeated alternately 5 to 8 times.

Figure 4E:
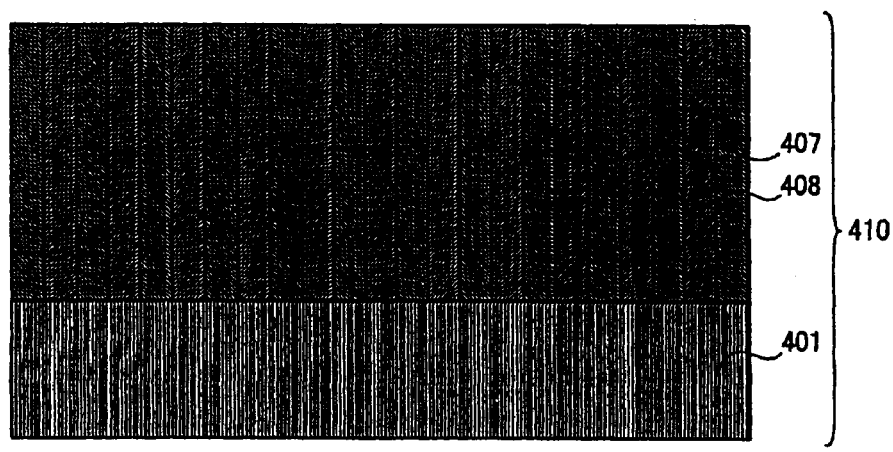
FIG. 4E is a fifth cross sectional view of the semiconductor device shown in FIG. 1 or 2 under the manufacture thereof by the second manufacturing method.

Then, by conducting a heat treatment at 1150° C. for 10 hours, super-junction semiconductor substrate 410 including an alternating conductivity type layer formed of p-type partition regions 407 (102) and n-type drift regions 408 (103) on n-type semiconductor substrate 401 is formed as shown in FIG. 4E. Then, by conducting further treatments same with those conducted by the foregoing first manufacturing method, the super-junction MOSFET shown in FIG. 1 or 2 is completed.

Figure 5:
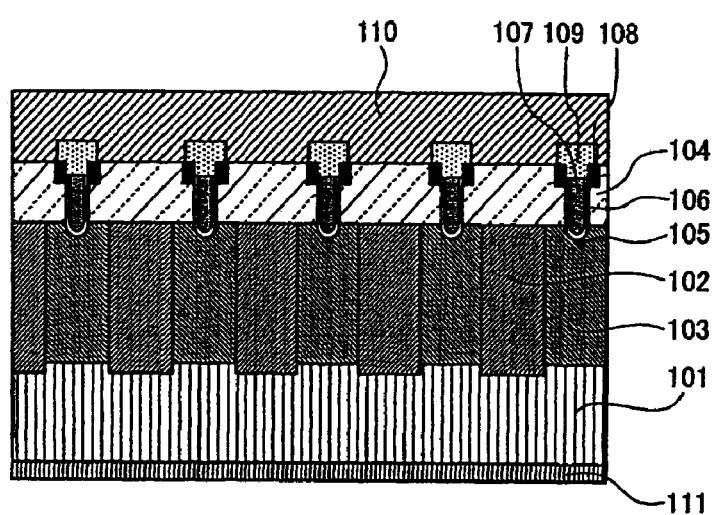
FIG. 5 is a cross sectional view of a conventional semiconductor device.

For comparing the breakdown voltages of the semiconductor devices as described later, a conventional semiconductor structure is described herein. FIG. 5 is a cross sectional view of a conventional semiconductor device. Referring now to FIG. 5, trenches 105 are formed in respective n-type drift regions 103 and positioned at the respective centers thereof.

Breakdown Voltages of Semiconductor Devices

Figure 6:
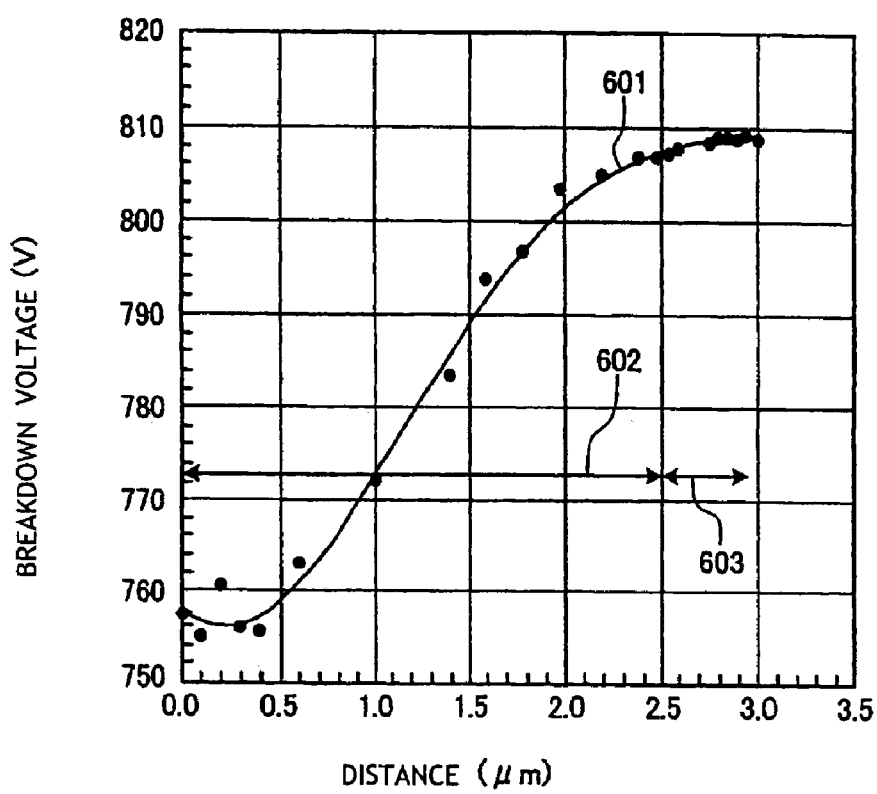
FIG. 6 is a graph describing the relations between the trench position and the breakdown voltage of the semiconductor device.

Now the breakdown voltages of the semiconductor devices according to the first and second embodiments will be described below. FIG. 6 is a graph describing the relations between the trench position and the breakdown voltage. In FIG. 6, the vertical axis represents the breakdown voltage and the horizontal axis the distance from the center of the n-type drift region. In the following descriptions, the distance from the center of the n-type drift region is represented by x.

When x=0 µm, trench 105 is in the center of n-type drift region 103 (cf. FIG. 5). When x=2.5 µm, one side wall of trench 105 is in contact with p-type partition region 102. When x=3.0 µm, the center of the width in the first direction of trench 105 is positioned on the pn-junction between p-type partition region 102 and n-type drift region 103 (cf. FIG. 2).

Figure 16:
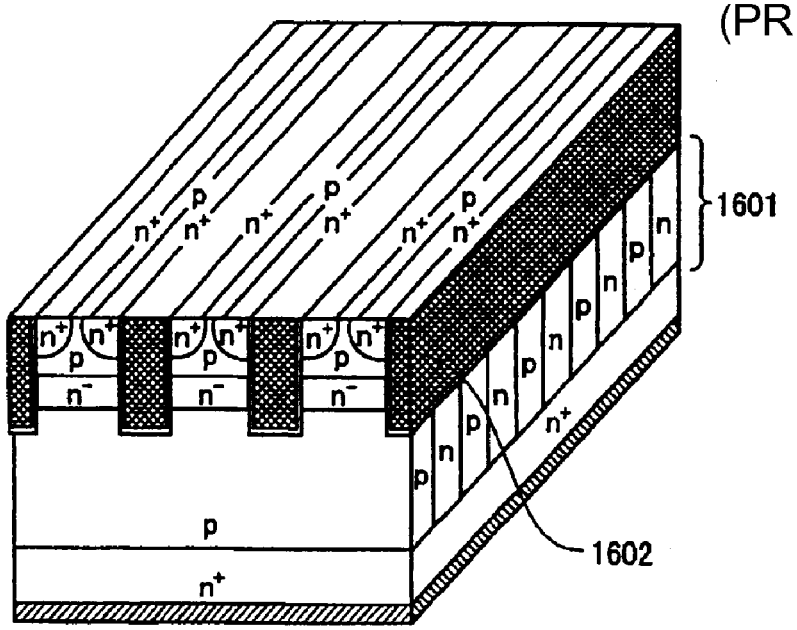
FIG. 16 is perspective view of a first conventional semiconductor device that employs a super-junction semiconductor substrate, in which the pn-junctions in an alternating conductivity type layer and trench gates are extended in perpendicular to each other.
Figure 17:
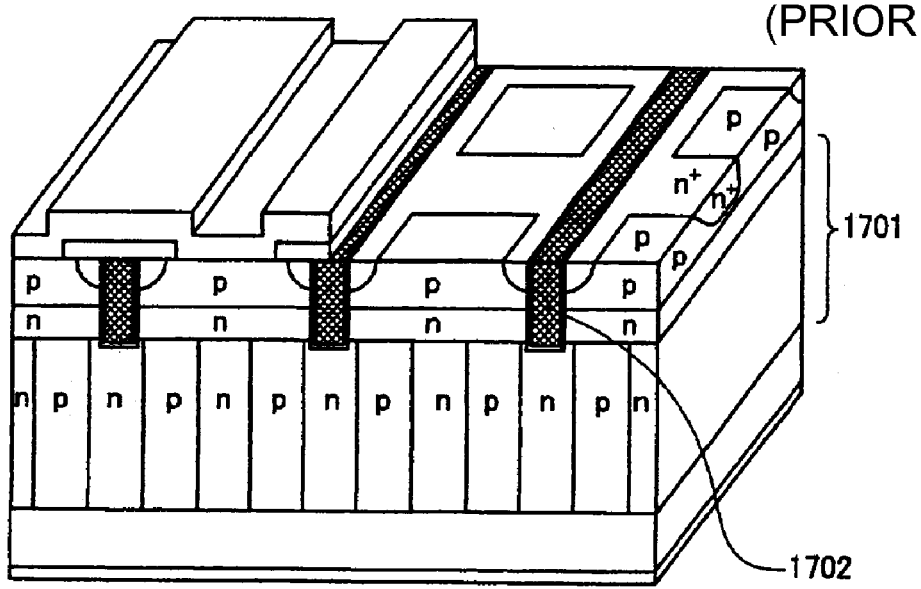
FIG. 17 is perspective view of a second conventional semiconductor device that employs a super-junction semiconductor substrate, in which the pn-junctions in an alternating conductivity type layer and trench gates are extended in parallel to each other.

First, the breakdown voltage of the semiconductor device according to the prior art will be described. The breakdown voltage of the semiconductor device in which the trenches and the stripe-shaped constituent regions in the alternating conductivity type layer cross an angle of almost 90 degrees (cf. FIG. 16) is 750 to 760 V, independent of the trench position. The breakdown voltage of the semiconductor device in which the trench opening width is wider than the width (12 µm) of a pair of p-type partition region 102 and n-type drift region 103 in the alternating conductivity type layer (cf. FIG. 18A), is around 780 V.

In FIG. 6, curve 601 is an approximate curve for the breakdown voltage values at various distances. An arrow-headed line segment 602 indicates the range in which trench 105 is formed in n-type drift region 103. In detail, arrow-headed line segment 602 indicates the range in which x=0 to 2.5 µm, arrow-headed line segment 603 indicates the range in which trench 105 is positioned over the pn-junction between p-type partition region 102 and n-type drift region 103, and arrow-headed line segment 603 indicates the range in which x=2.5 to 3.0 µm.

As described in FIG. 6, the variations of the breakdown voltage are small around x=0.0 µm and around x=3.0 µm. Therefore, the trench position suitable for reducing the variations of the breakdown voltage is around x=0.0 µm and around x=3.0 µm.

The breakdown voltage is 760 V at x=0.0 µm. As the distance value increases, the breakdown voltage lowers once (cf. curve 601). As trench 105 is positioned to be closer to p-type partition region 102, the breakdown voltage rises. At x=3.0 µm, the breakdown voltage is 810 V. Thus, the semiconductor device according to the second embodiment exhibits a breakdown voltage higher by 7 to 8% than the breakdown voltage of the conventional semiconductor device.

Figure 18A:
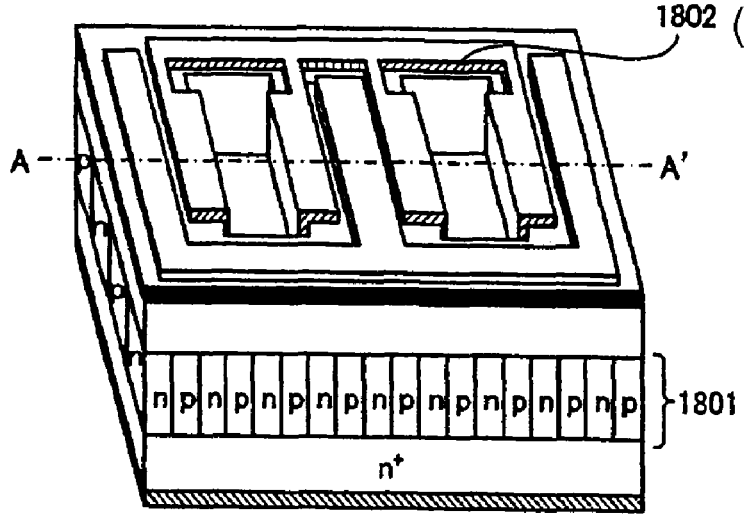
FIG. 18A is perspective view of a third conventional semiconductor device that employs a super-junction semiconductor substrate, in which the pn-junctions in an alternating conductivity type layer and trench gates are extended in parallel to each other.
Figure 18B:
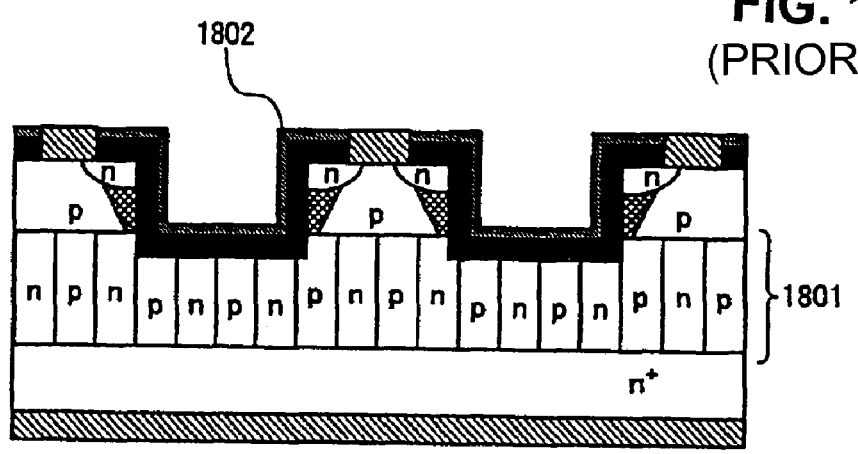
FIG. 18B is a cross sectional view of the third conventional semiconductor device shown in FIG. 18A.
Figure 19A:
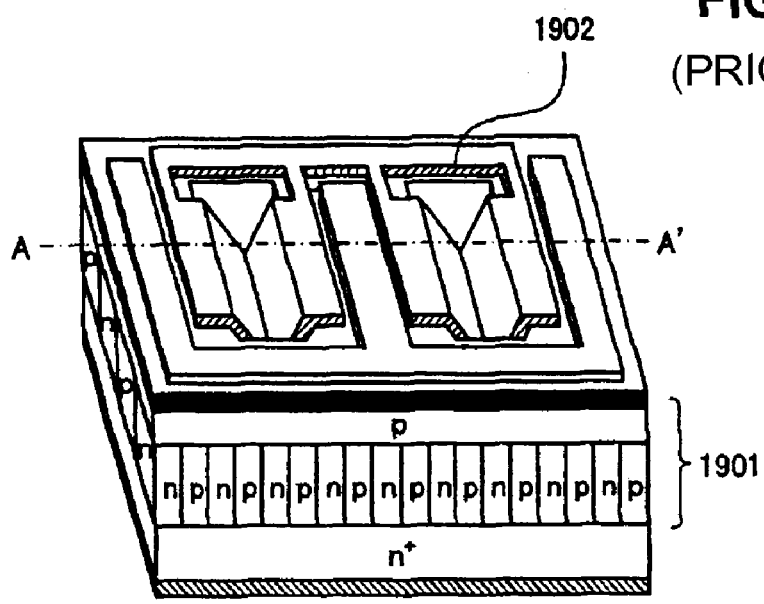
FIG. 19A is perspective view of a fourth conventional semiconductor device that employs a super-junction semiconductor substrate, in which the pn-junctions in an alternating conductivity type layer and trench gates are extended in parallel to each other.
Figure 19B:
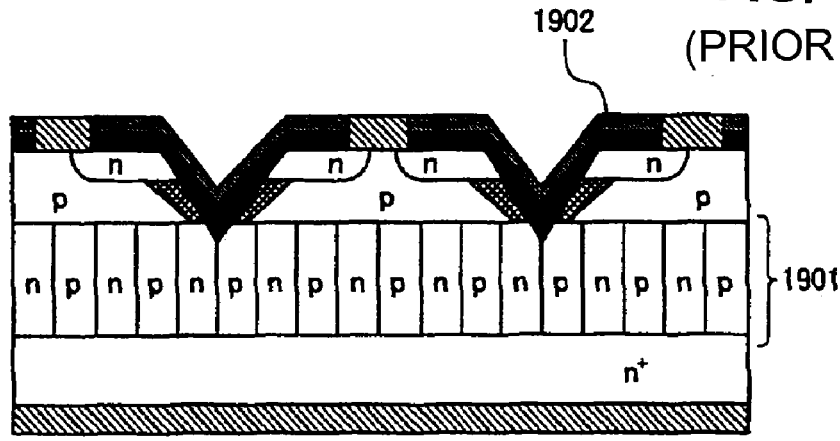
FIG. 19B is a cross sectional view of the fourth conventional semiconductor device shown in FIG. 19A.

It has been found that the semiconductor device according to the second embodiment exhibits a breakdown voltage higher by about 4% than the breakdown voltage of the semiconductor device shown in FIG. 18A. These results indicate that a semiconductor device exhibiting a high breakdown voltage, the variations of which are small, is obtained by arranging trenches 105 around x=3.0 µm and by setting the opening width of trenches 105 to be narrower than the width of a pair of p-type partition region 102 and n-type drift region 103 in the alternating conductivity type layer.

Internal Electric Field Strength when Avalanche Breakdown is Caused

Figure 7A:
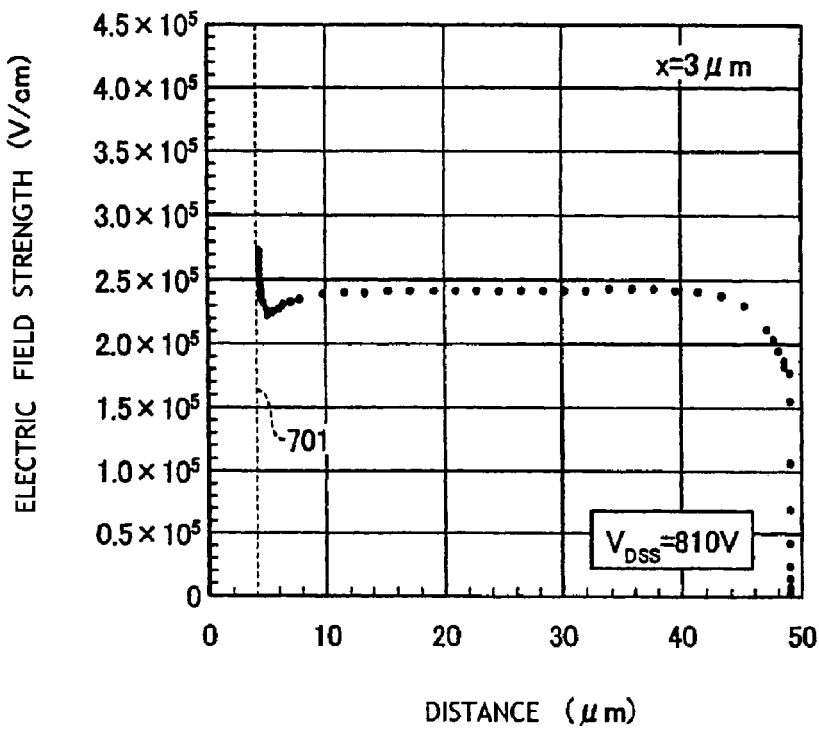
FIG. 7A is a graph describing the electric field distribution in the super-junction trench-gate MOSFET according to the second embodiment.
Figure 7B:
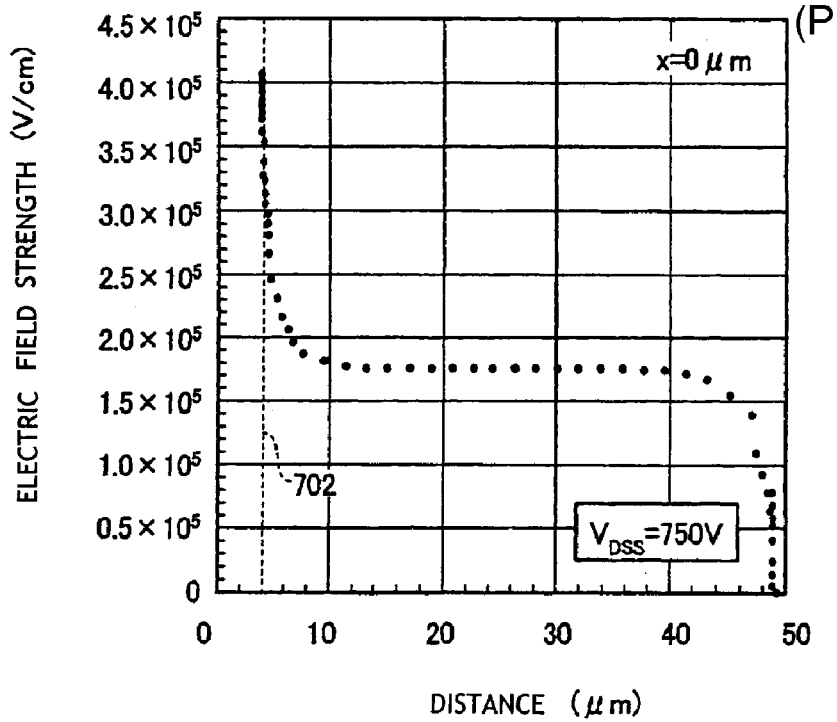
FIG. 7B is a graph describing the electric field distribution in the conventional super-junction trench-gate MOSFET.

For clarifying the reason why the breakdown voltage increases with increasing distance x (the maximum distance: 3.0 µm), the internal electric field strength, at the instance when avalanche breakdown is caused, is investigated by simulations. FIG. 7A is a graph describing the electric field distribution in the super-junction trench-gate MOSFET according to the second embodiment. FIG. 7B is a graph describing the electric field distribution in the conventional super-junction trench-gate MOSFET.

FIG. 7A shows the electric field distribution for x=3.0 µm that is the electric field distribution in the structure in which the center of trench 105 in the first direction is positioned on the pn-junction between p-type partition region 102 and n-type drift region 103. FIG. 7B shows the electric field distribution for x=0 µm that is the electric field distribution in the structure in which trench 105 is positioned in the center of n-type drift region 103 (cf. FIG. 5).

In FIGS. 7A and 7B, the vertical axes represent the internal electric field strength (V/cm) when avalanche breakdown is caused, and the horizontal axes represent the distance (µm) from the semiconductor device surface in the depth direction. FIGS. 7A and 7B describe the electric field distributions on the line containing the opening width center of trench 105.

Dotted line 701 in FIG. 7A and dotted line 702 in FIG. 7B represent the position for which the distance from the semiconductor device surface in the depth direction is 4 µm, that is, the bottom of trench 105. As FIGS. 7A and 7B indicate, the electric field strength in the bottom of trench 105 is higher when trench 105 is positioned at x=0 µm than when trench 105 is positioned at x=3 µm.

Electric Field Strength in Trench Bottom

Figure 8:
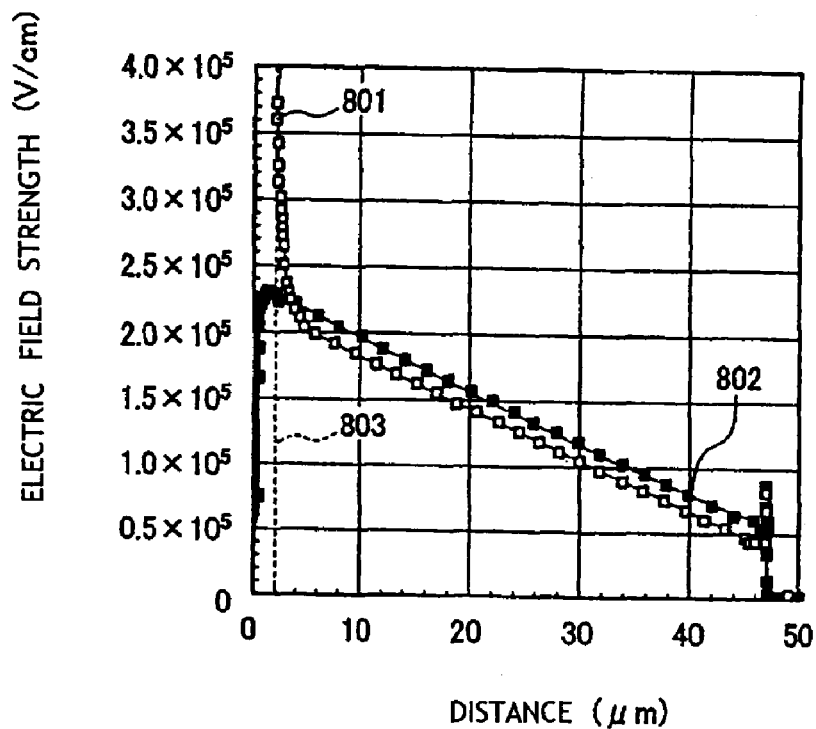
FIG. 8 is a graph describing the electric field distributions in a trench-gate MOSFET including an n-type semiconductor substrate and a diode including an n-type semiconductor substrate, in which any trench is not formed.

Electric field strengths are simulated for more detailed analysis on a trench-gate MOSFET including an n-type semiconductor substrate and a diode including an n-type semiconductor substrate, in which a trench is not formed. FIG. 8 is a graph describing the electric field distributions in the trench-gate MOSFET and the diode. In FIG. 8, the vertical axis represents the electric field strength (V/cm) and the horizontal axis the distance (µm) from the semiconductor device surface in the depth direction of the semiconductor device. Curve 801 represents the electric field strength distribution in the trench-gate MOSFET including an n-type semiconductor substrate and curve 802 represents the electric field strength distribution in the diode including an n-type semiconductor substrate but not including a trench.

Dotted line 803 represents the position at which the distance from the semiconductor device surface in the depth direction of the semiconductor device is 4 µm, which corresponds to the trench bottom. As FIG. 8 clearly describes, the electric field strength in the trench bottom of the trench-gate MOSFET including an n-type semiconductor substrate (cf. curve 801) rises sharply as compared with the electric field strength in the diode including an n-type semiconductor substrate but not including any trench (cf. curve 802). The sharp rise of the electric field strength is caused in the trench-gate MOSFET including an n-type semiconductor substrate, since the curved bottom of trench 105 is protruding from p-type channel region 104 into n-type drift region 103.

Electric Field Strength at Avalanche Breakdown of Super-Junction Diode

Figure 9:
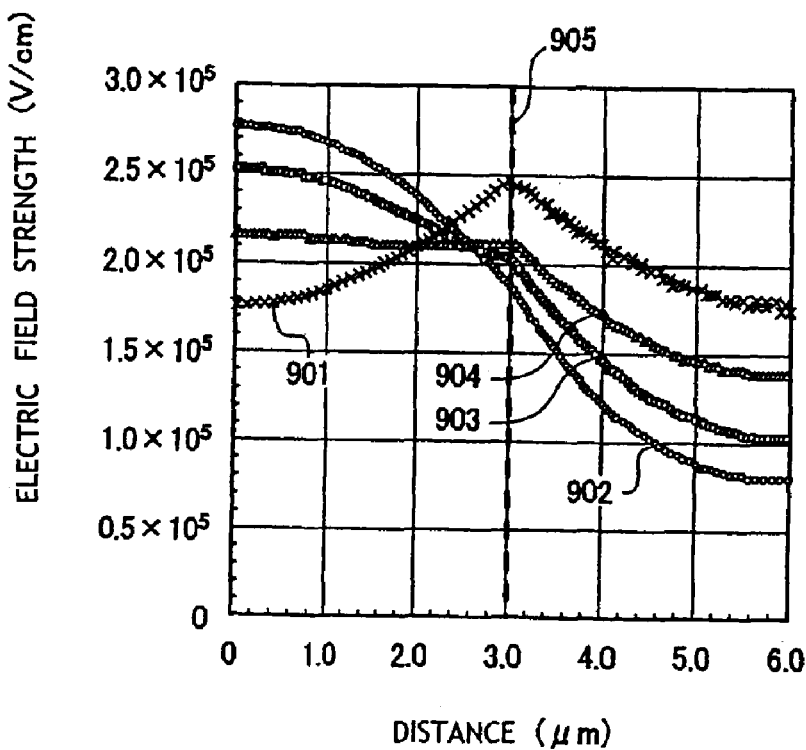
FIG. 9 is a graph describing the electric field distribution in the lateral direction of the super-junction diode including an n-type semiconductor substrate but not including any trench.

Now the results of simulation on the electric field strength when avalanche breakdown is caused in the super-junction diode not including trench 105 will be described below. FIG. 9 is a graph describing the electric field distribution in the lateral direction of the super-junction diode including an n-type semiconductor substrate but not including any trench. In FIG. 9, the vertical axis represents the electric field strength (V/cm) and the horizontal axis represents the distance (µm) from the center of the width in the first direction of the n-type drift region.

The curves in FIG. 9 represent the electric field distributions at the positions spaced apart for the predetermined distances from p-type channel region 104. In detail, curve 901 represents the electric field distribution for the distance of 10 µm, curve 902 for the distance of 0.5 µm, curve 903 for the distance of 1.0 µm, and curve 904 for the distance of 1.5 µm. Now the distance from the p-type channel region will be described below.

Figure 10:
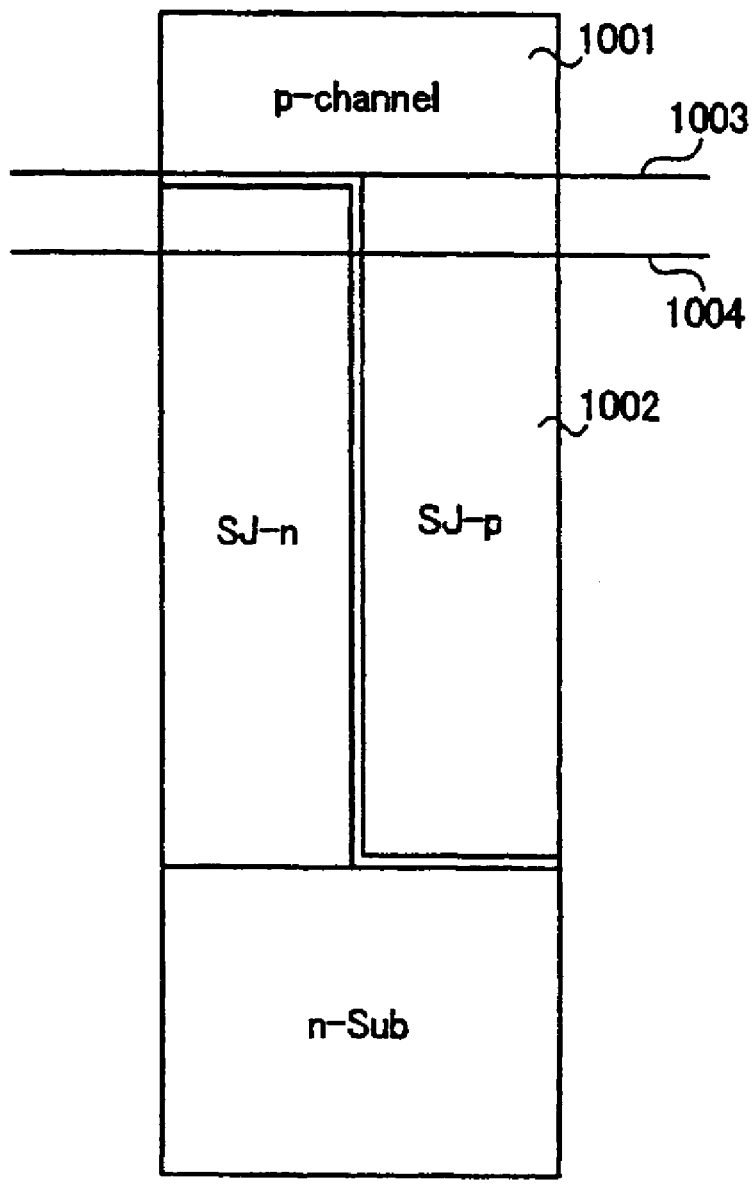
FIG. 10 is a drawing for explaining the distance from the p-type channel region.

FIG. 10 is a drawing for explaining the distance from the p-type channel region. Referring now to FIG. 10, the distance from a p-type channel region 1001 to a predetermined position is calculated based on the reference set at the boundary between the relevant p-type channel region 1001 and a p-type partition region 1002. In detail, line 1003 is a reference line and the distance between lines 1003 and 1004 is the predetermined distance.

Referring again to FIG. 9, dotted line 905 indicates the boundary between p-type partition region 102 and n-type drift region 103. In FIG. 9, at the positions where the distance thereof from p-type channel region 104 is 10 μm (or deeper), the electric field strength in the vicinity of x=0 μm is much lower than the electric field strength in the vicinity of x=3 μm (cf. curve 901).

At the positions closer to p-type channel region 104, the electric field strength in the vicinity of x=3 μm is lower than the electric field strength in the vicinity of x=0 μm (cf. curves 902, 903, and 904). As described above, the electric field strength in the vicinity of x=3 μm is lower than the electric field strength in the vicinity of x=0 μm for the distance from p-type channel region 104 of 1.5 μm or shorter.

This is because parts of n-type drift regions 103 of the n-type region formed of heavily doped n-type semiconductor substrate 101 and n-type drift regions 103 have convex portions toward the p-type region formed of p-type channel regions 104 and p-type partition regions 102. In other words, the rise of the electric field strength in the bottom of trench and the rise of the electric field strength in the central portion of the width in the first direction of n-type drift region 103 are caused due to the convex portions described above.

Therefore, a super-junction trench-gate MOSFET in which the opening width of trench 105 is set much narrower than the width of a pair of p-type partition region 102 and n-type drift region 103 and trench 105 is positioned in the vicinity of x=3 μm, that is on the boundary between p-type partition region 102 and n-type drift region 103, facilitates obtaining a high breakdown voltage. In other words, a high breakdown voltage is obtained because the trench bottom, in which electric field strength rise is caused, is displaced from the central portion of the width in the first direction of n-type drift region 103 in the alternating conductivity type layer, in which electric field strength rise is caused.

Moreover, at the positions at which the distance from p-type channel region 104 is 1.0 to 1.5 μm and the electric field strengths are described by curves 902 and 903, the electric field strength change in the high-electric-field portion of n-type drift region 103 is small. In other words, by setting the bottom portion length of trench 105 extending into n-type drift region 103 to be 1.0 to 1.5 μm, a high breakdown voltage is obtained and the variations of the breakdown voltage are reduced.

On-Resistance Characteristics

Figure 11:
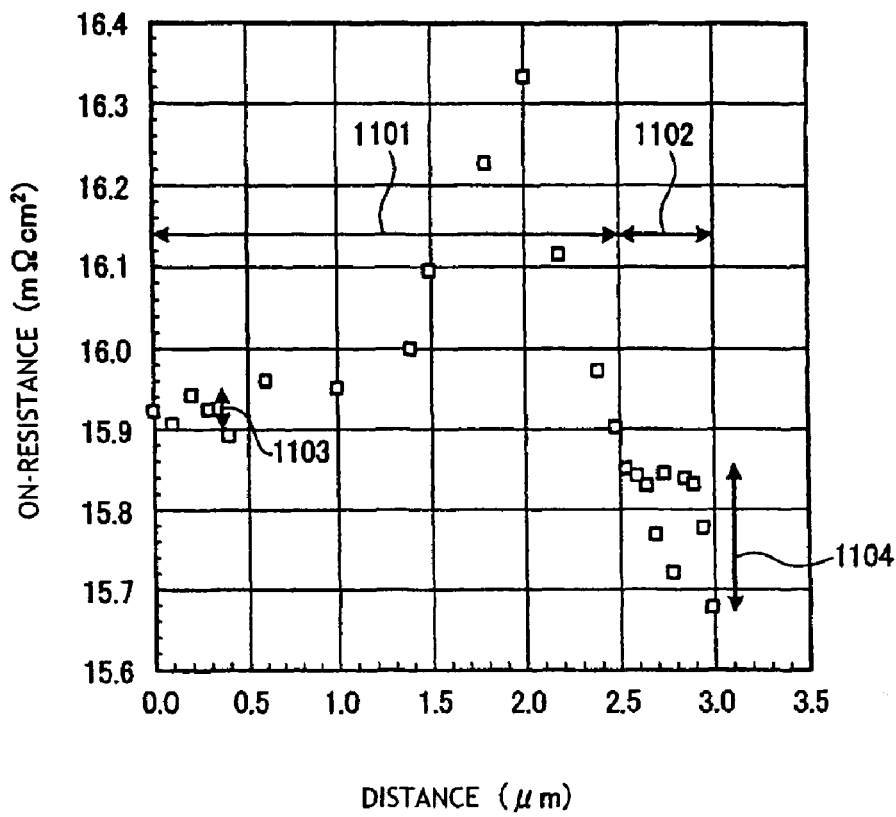
FIG. 11 is a graph describing the on-resistance changes caused by changing the trench position in a super-junction trench-gate MOSFET.

Now the influence of the trench position on the on-resistance of a super-junction trench-gate MOSFET will be described below. FIG. 11 is a graph describing the on-resistance changes caused by changing the trench position in a super-junction trench-gate MOSFET. In FIG. 11, the vertical axis represents the on-resistance (mΩcm$^2$) and the horizontal axis represents the distance (μm) from the center of n-type drift region 103. Arrow-headed line segment 1101 indicates the range in which trench 105 is formed in n-type drift region 103. In other words, arrow-headed line segment 1101 indicates the range in which x=0.0 μm to 2.5 μm. Arrow-headed line segment 1102 indicates the range in which trench 105 is formed over the pn-junction between p-type partition region 102 and n-type drift region 103. In other words, arrow-headed line segment 1102 indicates the range in which x=2.5 μm to 3.0 μm.

In FIG. 11, the on-resistance at x=0.0 μm is about 15.9 mΩcm$^2$. As the distance (x) increases, the on-resistance rises and shows a maximum in the vicinity of x=2.0 μm. As the distance (x) increases further, the on-resistance drops and shows a minimum in the vicinity of x=3.0 μm.

Now the variations of the on-resistance will be described below. Arrow-headed line segment 1103 indicates the range for which the on-resistance value varies in the vicinity of x=0.0 μm (0.0 μm to 0.5 μm). Arrow-headed line segment 1104 indicates the range for which the on-resistance value varies in the vicinity of x=3.0 μm (2.5 μm to 3.0 μm).

As described above, for obtaining lower on-resistance in the semiconductor devices, it is preferable to position trench 105 in the vicinity of x=3.0 μm. To reduce the on-resistance variation, it is more preferable to position trench 105 in the vicinity of x=0.0 μm than to position trench 105 in the vicinity of x=3.0 μm.

Figure 12A:
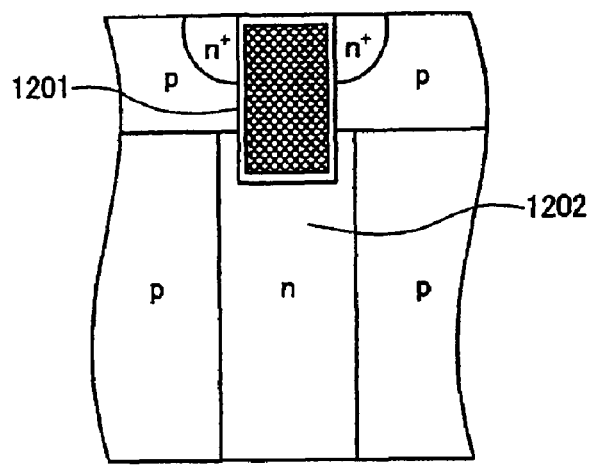
FIG. 12A is a cross sectional view showing a conventional trench arrangement.
Figure 12B:
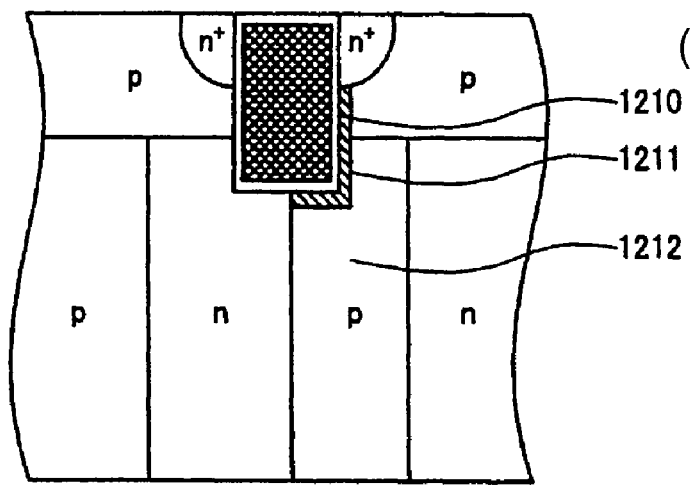
FIG. 12B is a cross sectional view showing another conventional trench arrangement, in which the trench is displaced from the position, at which the trench in FIG. 12A is positioned.

Now phenomena that are the same as those pointed out in the Published Unexamined Japanese Patent Application 2004-200441 will be described below. FIG. 12A is a cross sectional view showing a conventional trench arrangement. FIG. 12B is a cross sectional view showing another trench arrangement in which the trench is displaced from the position at which the trench in FIG. 12A is positioned. When trench 1201 shown in FIG. 12A is displaced to the position of trench 1210 in FIG. 12B, on-resistance increase has been confirmed. When trench 1210 contacts with p-type partition region 1212, MOS channel 1211 is formed in p-type partition region 1212 and causes an increase in the on-resistance in MOS channel 1211.

It is estimated that the conventional example (disclosed in the Published Unexamined Japanese Patent Application 2004-200441) has pointed out that on-resistance increase or characteristics variations will be caused if the position of trench 105 is varied within the range of x=0.0 μm to 3.0 μm shown in FIG. 11.

However, FIG. 11 indicates that on-resistance variations are smaller, as far as the position of trench 105 is varied within the range of 0.5 μm, when trench 105 is positioned in the vicinity of x=0.0 μm than when trench 105 is positioned in the vicinity of x=3.0 μm. The reason for this is considered as follows. The on-resistance of MOS channel 1211 caused in p-type partition region 1212 as shown in FIG. 12B changes relatively greatly depending on the impurity concentration distribution in the lateral direction of p-type partition region 1212 and the impurity concentration variations. If MOS channel 1211 caused in p-type partition region 1212 in FIG. 12B is made not to work, the on-resistance variations will be reduced. Semiconductor devices according to the third and fourth embodiments of the invention, in which MOS channel 1211 is made not to work, will be described below.

As described above, in the semiconductor device according to the second embodiment, the trench thereof is formed over the pn-junction between the p-type partition region and n-type drift region. Therefore, the semiconductor device according to the second embodiment facilitates obtaining a higher breakdown voltage and reducing the breakdown voltage variations.

Third Embodiment

Figure 13:
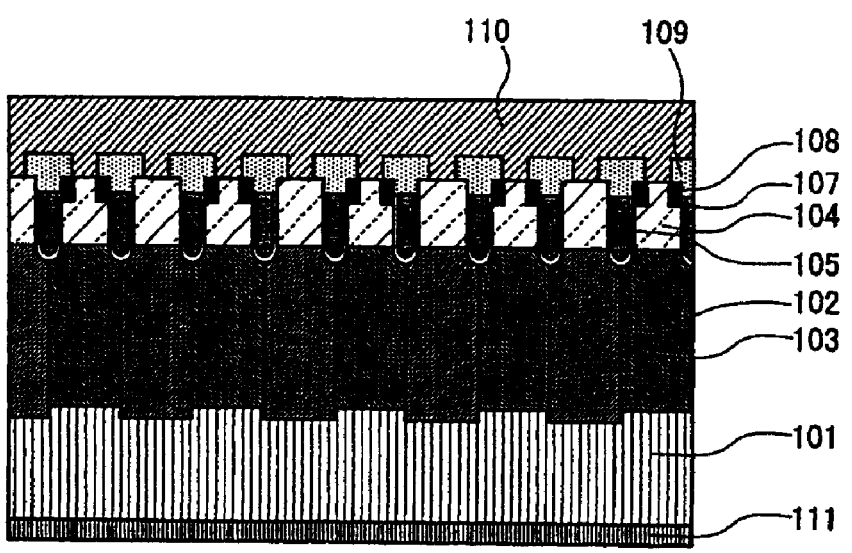
FIG. 13 is a cross sectional view of a semiconductor device according to a third embodiment of the invention.

Now a semiconductor device according to a third embodiment of the invention, in which the MOS channel caused in the channel region on p-type partition region 102 is made not to work, will be described below. FIG. 13 is a cross sectional view of a semiconductor device according to the third embodiment of the invention. Referring now to FIG. 13, although n-type source regions 108 are formed on both outer side walls of trench 105 in the semiconductor device according to the second embodiment, n-type source region 108 is formed on one side wall of trench 105 in the semiconductor device according to the third embodiment. Since the other configurations are the same as those in the semiconductor device according to the second embodiment, their duplicated descriptions are omitted for the sake of simplicity.

In FIG. 13, n-type source region 108 is formed on one side wall of trench 105. In detail, n-type source regions 108 are formed on the respective opening edges of trenches 105 such that n-type source regions 108 are in p-type channel region 104 above n-type drift region 103. By forming no n-type source region 108 in p-type channel region 104 above p-type partition region 102, the MOS channel is prevented from working. Although the on-resistance characteristics of the semiconductor device according to the third embodiment will be described later, the semiconductor device according to the third embodiment facilitates reducing the on-resistance variations.

Fourth Embodiment

Figure 14:
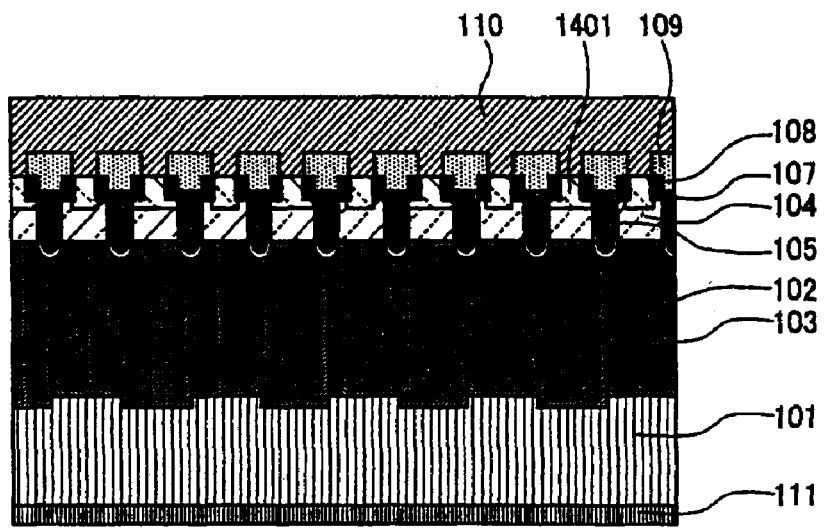
FIG. 14 is a cross sectional view of a semiconductor device according to a fourth embodiment of the invention.

Now a semiconductor device according to a fourth embodiment of the invention will be described below. FIG. 14 is a cross sectional view of a semiconductor device according to the fourth embodiment of the invention. The semiconductor device according to the fourth embodiment is different from the semiconductor device according to the second embodiment in that p-type body region 1401 is formed in p-type channel region 104 in the semiconductor device according to the fourth embodiment. Since the other configurations are the same as those in the semiconductor device according to the second embodiment, their duplicated descriptions are omitted for the sake of simplicity.

Referring now to FIG. 14, p-type body region 1401 is formed from the surface of p-type channel region 104. The bottom of p-type body region 1401, i.e., the boundary between p-type body region 1401 and p-type channel region 104, is positioned more deeply than the bottom of n-type source region 108. In p-type channel region 104 on p-type partition region 102, p-type body region 1401 is formed such that p-type body region 1401 is in contact with the side walls of trenches 105.

In p-type channel region 104 on n-type drift region 103, p-type body region 1401 is formed such that p-type body region 1401 is spaced apart from the side walls of trenches 105. The configuration described above facilitates making the MOS channel on the side of p-type partition region 102 not to work. The configuration described above also facilitates reducing the on-resistance variations of the semiconductor device.

Method of Manufacturing Semiconductor Device

Now the method of manufacturing the semiconductor device according to the fourth embodiment will be described below. First, super-junction semiconductor substrate 410 is formed through the same process as the process of the second manufacturing method according to the invention. Then, trenches 105 of 3.5 µm in depth and 1.2 µm in opening width are formed at the predetermined positions at a pitch of 6 µm such that trenches 105 are spaced apart for an equal spacing from each other.

Then, gate oxide film 106 is grown on the inner wall of trench 105 and gate electrode 107 is buried in trench 105. Gate oxide film 106 is, for example, 100 nm in thickness. Next, p-type channel regions 104 are formed, and a mask is formed at a predetermined position on p-type channel regions 104. The mask is formed such that the mask covers trenches 105 and a part of p-type channel regions on n-type drift regions 103. Then, p-type impurity ions are implanted at a high concentration and a heat treatment is conducted to form p-type body regions 1401 at the respective locations shown in FIG. 14.

Then, n-type source regions 108 are formed and interlayer insulator films 109, source electrode 110, drain electrode 111, and passivation films are formed. Thus, the super-junction MOSFET shown in FIG. 14 is completed. The p-type body regions 1401 in p-type channel regions 104 on p-type partition regions 102, and p-type body regions 1401 in p-type channel regions 104 on n-type drift regions 103 are formed through the same process. Therefore, the manufacturing process for manufacturing the semiconductor device according the fourth embodiment is simplified.

On-Resistance Characteristics

Figure 15:
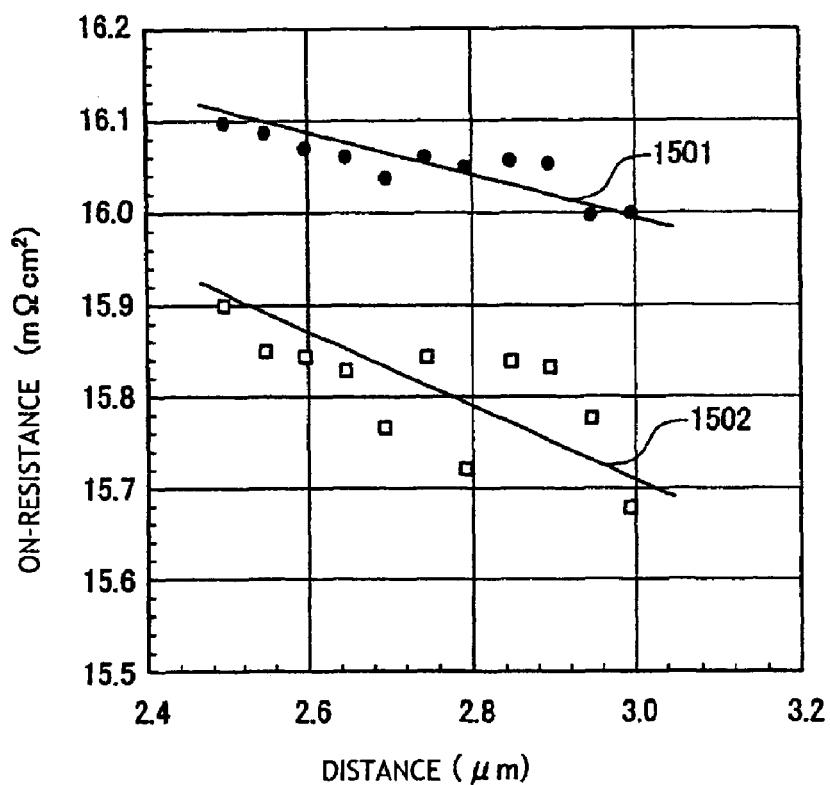
FIG. 15 is a graph describing the relations between the on-resistance and the distance in the semiconductor devices according to the third and fourth embodiments.

Now the relations between the on-resistance and the distance in the semiconductor devices according to the third and fourth embodiments will be described below. FIG. 15 is a graph describing the relations between the on-resistance and the distance in the semiconductor devices according to the third and fourth embodiments. In FIG. 15, the vertical axis represents the on-resistance (mΩcm$^2$) and the horizontal axis represents the distance (µm) in the first direction.

Line 1501 is an approximate line approximating the on-resistance values of the semiconductor device according to the third or fourth embodiment, in which the MOS channels on the side of p-type partition regions 102 do not work. Line 1502 is an approximate line approximating the on-resistance values of the conventional semiconductor device, in which the MOS channels on the side of p-type partition regions 102 work. As described in FIG. 15, variations are smaller for the on-resistance values approximated by line 1501 than for the on-resistance values approximated by line 1502.

As described above, the semiconductor devices according to the third and fourth embodiment facilitate preventing the MOS channels in the p-type channel regions on the p-type partition regions from working. Therefore, the semiconductor devices according to the third and fourth embodiment facilitate reducing the on-resistance variations.

The semiconductor structures according to the invention are useful for semiconductor devices for high-electric-power use. Especially, the semiconductor structures according to the invention are best suited for MOSFETs, IGBTs, and bipolar transistors, which include an alternating conductivity type layer in the drift section thereof and realize a high breakdown voltage and low on-resistance simultaneously.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device comprising:
   a semiconductor substrate of a first conductivity type;
   an alternating conductivity type layer on the semiconductor substrate, the alternating conductivity type layer comprising first semiconductor regions of the first conductivity type and second semiconductor regions of a second conductivity type arranged alternately;
   channel regions of the second conductivity type on the alternating conductivity type layer; and
   trenches extending through the channel regions with each of the trenches extending to both the first and second semiconductor regions, wherein the bottom of the trench is formed over a boundary between the first semiconductor region and the second semiconductor region, and wherein a widest opening width of the trench is narrower than the width of a pair of first and second semiconductor regions.

2. The semiconductor device according to claim 1, wherein the opening width of the trench is narrower than one-half the width of the first semiconductor region and the second semiconductor region.

3. The semiconductor according to claim 2, wherein each of the trenches contacts both the first and second semiconductor regions at the boundary of one pair of adjacent first and second semiconductor regions so that the trenches contact all of the plurality of pairs of adjacent first and second semiconductor regions at the boundary.

4. The semiconductor device according to claim 1, wherein the deepest part in the bottom of the trench is positioned on the first boundary.

* * * * *